(12) United States Patent
Yu et al.

(10) Patent No.: US 7,692,181 B2
(45) Date of Patent: Apr. 6, 2010

(54) GALLIUM-NITRIDE BASED LIGHT EMITTING DIODE LIGHT EMITTING LAYER STRUCTURE

(75) Inventors: Cheng-Tsang Yu, Wufong Township, Taichung County (TW); Liang-Wen Wu, Banciao (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 890 days.

(21) Appl. No.: 11/458,392

(22) Filed: Jul. 19, 2006

(65) Prior Publication Data

US 2006/0249727 A1    Nov. 9, 2006

Related U.S. Application Data

(62) Division of application No. 10/939,689, filed on Sep. 11, 2004, now abandoned.

(51) Int. Cl.
*H01L 31/00* (2006.01)

(52) U.S. Cl. .............................. 257/15; 257/14; 257/79; 257/E39.011; 257/E33.01; 257/E29.072

(58) Field of Classification Search ............. 257/15–18, 257/14, 79, E39.011, E33.01, E29.072
See application file for complete search history.

(56) References Cited

U.S. PATENT DOCUMENTS

2003/0005880 A1*  1/2003  Razeghi ........................ 117/86

* cited by examiner

*Primary Examiner*—Davienne Monbleau
*Assistant Examiner*—Matthew Reames

(57) ABSTRACT

A number of light-emitting layer structures for the GaN-based LEDs that can increase the lighting efficiency of the GaN-based LEDs on one hand and facilitate the growth of epitaxial layer with better quality on the other hand are provided. The light-emitting layer structure provided is located between the n-type GaN contact layer and the p-type GaN contact layer. Sequentially stacked on top of the n-type GaN contact layer is the light-emitting layer containing a lower barrier layer, at least one intermediate layer, and an upper barrier layer. That is, the light-emitting layer contains at least one intermediate layer interposed between the upper and lower barrier layers. When there are multiple intermediate layers inside the light-emitting layer, there is an intermediate barrier layer interposed between every two immediately adjacent intermediate layers.

7 Claims, 7 Drawing Sheets

GALLIUM-NITRIDE BASED LIGHT EMITTING DIODE LIGHT EMITTING LAYER STRUCTURE

CROSS-REFERENCES TO RELATED APPLICATIONS

This is a division of U.S. application Ser. No. 10/939,689, filed Sep. 11, 2004 now abandoned.

BACKGROUND OF THE INVENTION

1. Field of the Invention

The present invention relates to the gallium-nitride (GaN) based light emitting diode (LED), and in particular to the structure of the light-emitting layer of the GaN-based LED.

2. The Prior Arts

LEDs have long been widely used as indicators or light sources in various electronic consumer devices due to their features including low power consumption, low heat dissipation, and long operation life. In recent years, researches have been focused on the development of LEDs with various colors and LEDs with high luminance. Among these researches, highly efficient and illuminant blue-light LEDs that can be put to practical use receive the most attention. In October 1995, Nichia Corporation, Japan, announced the successful production of highly illuminant blue-light LEDs based on the indium-gallium-nitride (InGaN) material. This breakthrough has led the world's optoelectronic industry to invest tremendous capitals and resources in the gallium-nitride (GaN) based, such as GaN, aluminum-gallium-nitride (AlGaN), indium-gallium-nitride (InGaN), etc., LEDs.

FIG. 1 is a schematic diagram showing the structure of a GaN-based LED according to prior arts. As shown in FIG. 1, the conventional structure of a GaN-based LED contains a substrate 10 made of sapphire. Then, on one side of the sapphire substrate 10, the GaN-based LED further contains an n-type GaN contact layer 11, an InGaN light-emitting layer 12, and a p-type GaN contact layer 13, sequentially stacked from bottom to top in this order. In addition, there are a positive electrode 14 and a negative electrode 15 stacked upon the p-type GaN contact layer 13 and the n-type GaN contact layer 11 respectively. Within this conventional GaN-based LED structure, the light-emitting layer 12 usually has a multi-quantum well (MQW) structure made of $In_xGa_{1-x}N$ ($0 \leq x \leq 1$). The electrons and holes are joined with each other within the $In_xGa_{1-x}N$ ($0 \leq x \leq 1$) potential well and photons are thereby released. Please note that the epitaxial growth of the $In_xGa_{1-x}N$ ($0 \leq x \leq 1$) requires a very high temperature to obtain epitaxial layer with better quality. On the other hand, to increase the possibility of forming the electron-hole pairs and thereby the lighting efficiency, the growing temperature of the $In_xGa_{1-x}N$ ($0 \leq x \leq 1$) cannot be higher than 850° C. so that multiple localized states can be formed from the characteristics of the $In_xGa_{1-x}N$ ($0 \leq x \leq 1$) such as indium segregation and phase separation. This is a dilemma requiring an appropriate solution.

SUMMARY OF THE INVENTION

To overcome the foregoing disadvantages, the present invention provides a number of light-emitting layer structures for the GaN-based LEDs that can increase the lighting efficiency of the GaN-based LEDs on one hand and facilitate the growth of epitaxial layer with better quality on the other hand.

The light-emitting layer structure provided by the present invention is located between the n-type GaN contact layer and the p-type GaN contact layer. Sequentially stacked on top of the n-type GaN contact layer in the following order, the light-emitting layer contains a lower barrier layer, at least one intermediate layer, and an upper barrier layer. That is, the light-emitting layer contains at least one intermediate layer interposed between the upper and lower barrier layers. When there are multiple intermediate layers inside the light-emitting layer, there is an intermediate barrier layer interposed between every two immediately adjacent intermediate layers.

The upper and lower barrier layers have higher band gaps than that of the intermediate layer so that the electrons and the holes have a higher possibility joining with each other within the intermediate layer, which in turn increases the lighting efficiency of the GaN-based LED. The barrier layers each have a thickness between 5 Å and 300 Å, and a growing temperature between 400° C. and 1000° C.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
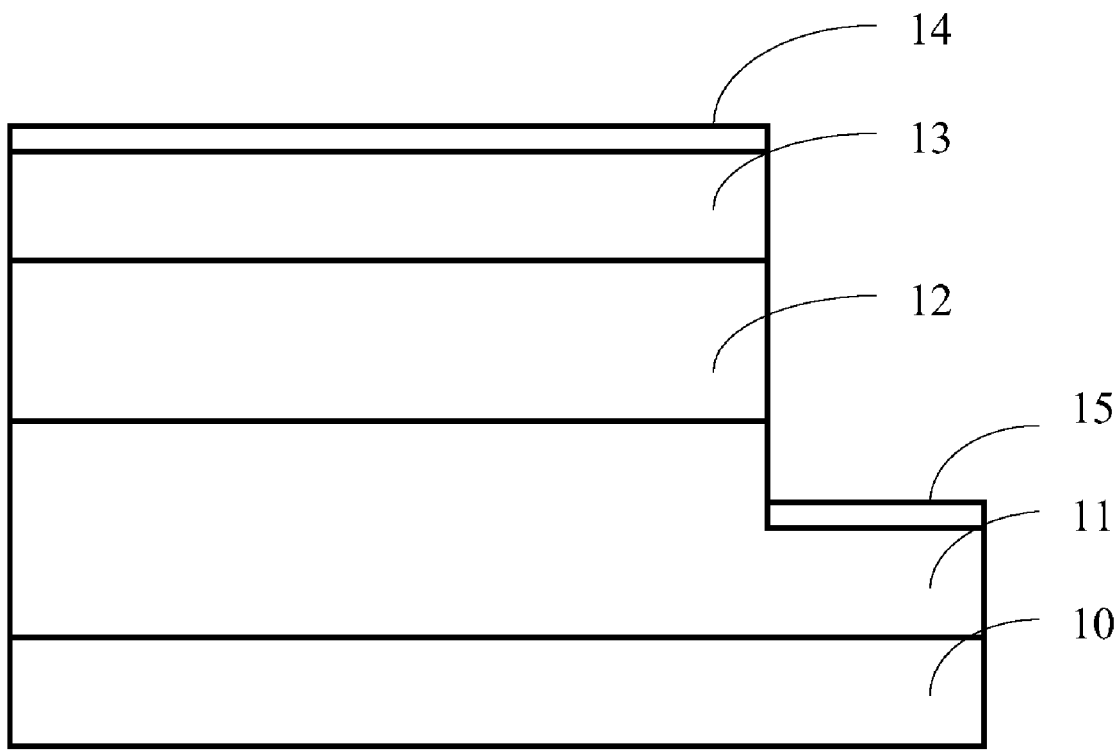
FIG. 1 is a schematic diagram showing the structure of a conventional GaN-based LED.
Figure 2A:
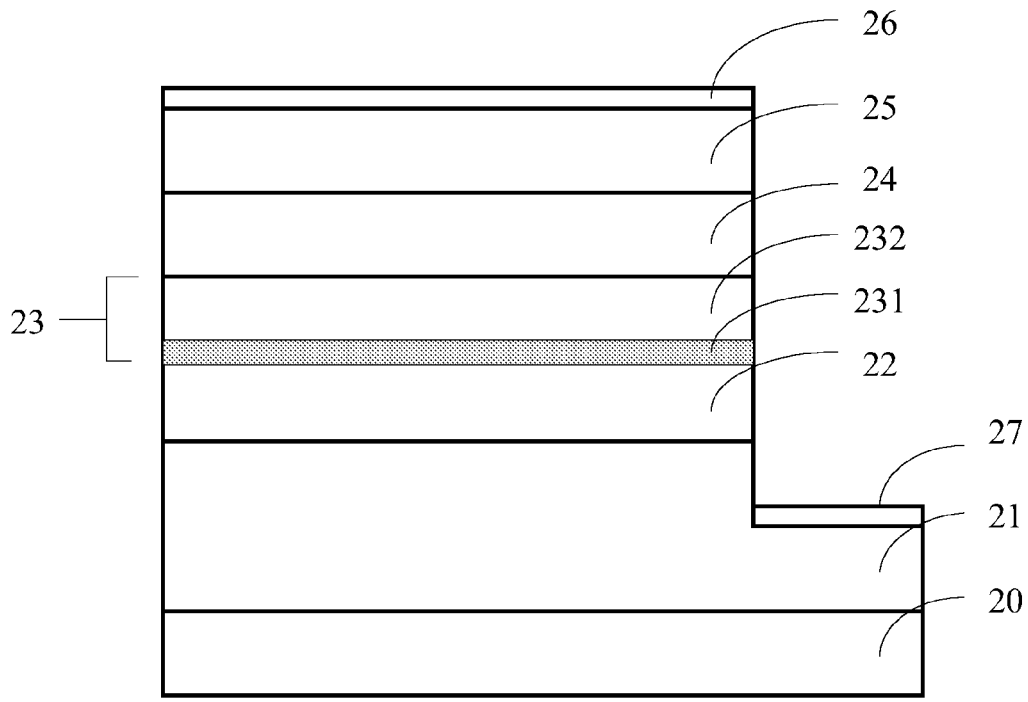
FIGS. 2(a), 2(b), and 2(c) are schematic diagrams showing the GaN-based LED structures according to a first embodiment of the present invention.
Figure 2B:
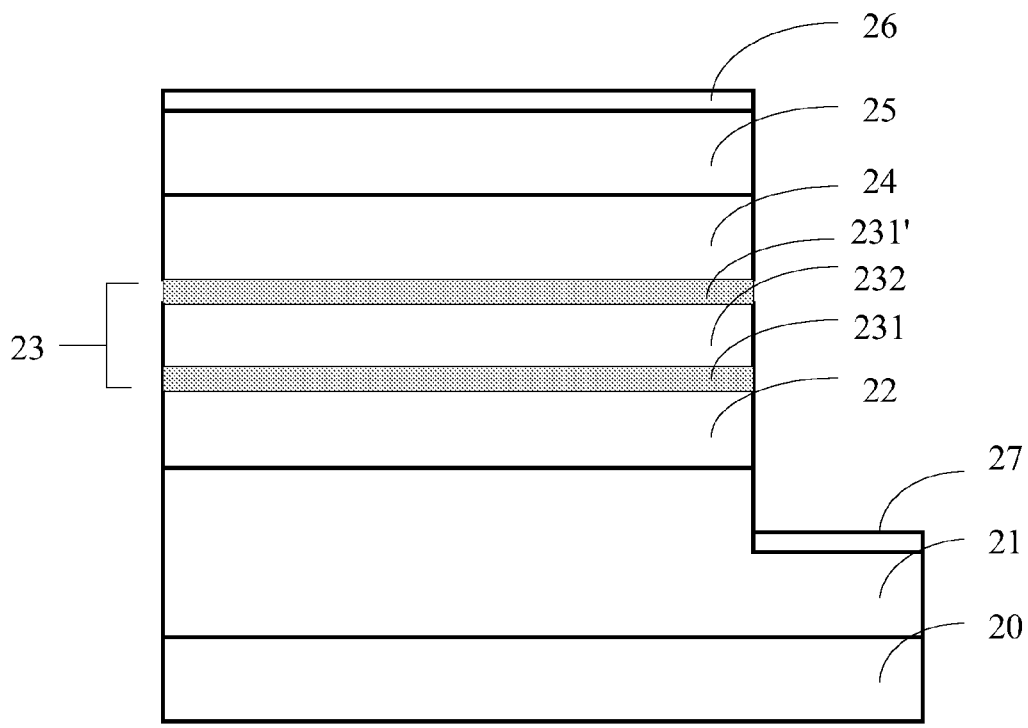
Figure 2C:
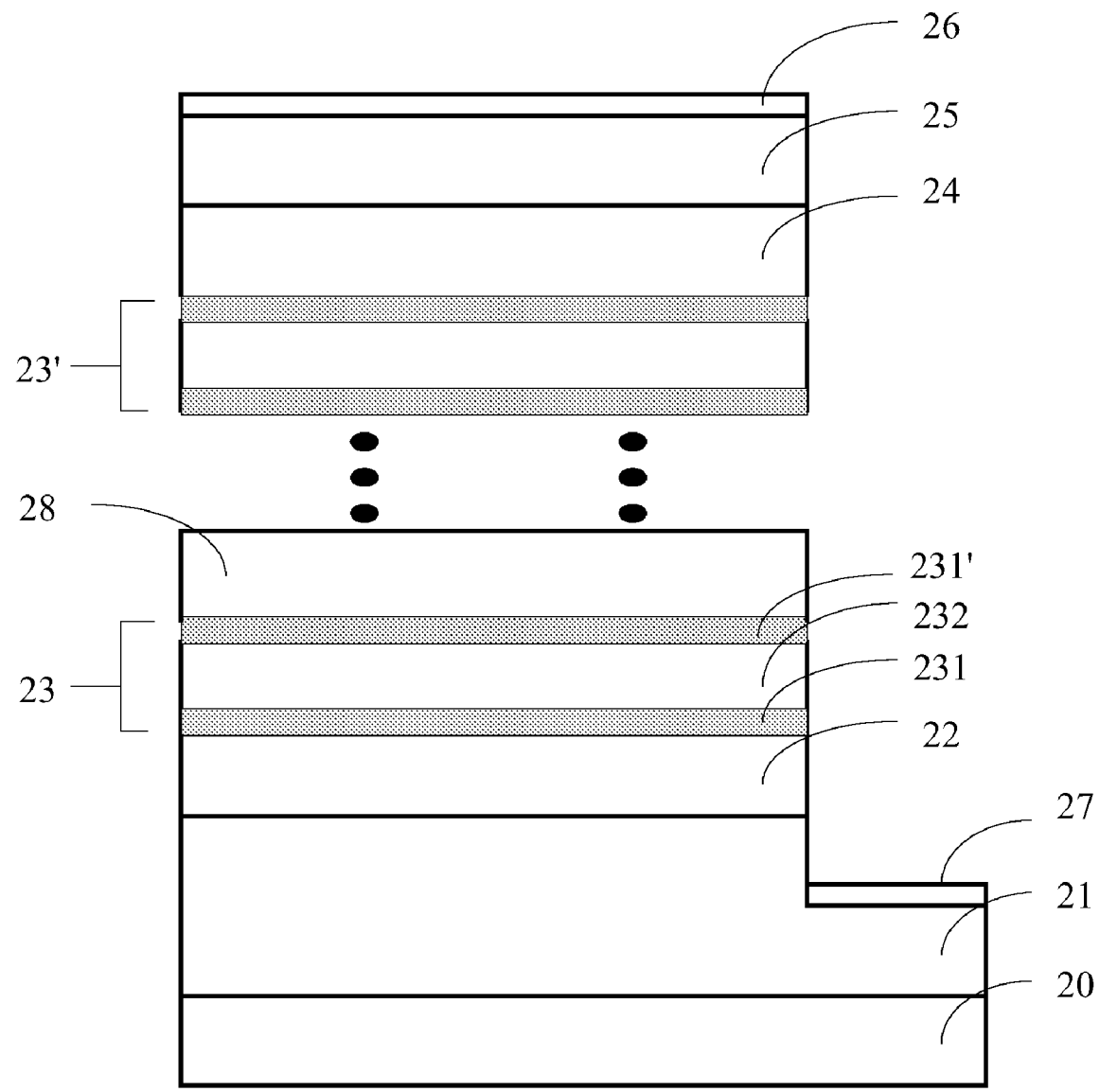

FIGS. 2(a), 2(b), and 2(c) are schematic diagrams showing the GaN-based LED structures according to a first embodiment of the present invention. As shown in FIGS. 2(a), 2(b), and 2(c), the GaN-based LED structures use sapphire as the substrate 20. Then, sequentially from bottom to top on the sapphire substrate 20, the GaN-based LED structures contain a n-type GaN contact layer 21, a lower barrier layer 22 made of un-doped aluminum-gallium-indium-nitride ($Al_{1-x-y}Ga_xIn_yN$, $0 \leq x, y \leq 1, x+y \leq 1$), at least an intermediate layer 23, an upper barrier layer 24 made of un-doped $Al_{1-p-q}Ga_pIn_qN$ ($0 \leq p, q \leq 1, p+q \leq 1$), and a p-type GaN contact layer 25. The GaN-based LED structures further contain a positive electrode 26 and a negative electrode 27 on top of the p-type GaN contact layer 25 and the n-type GaN contact layer 21 respectively.

As shown in FIG. 2(a), the intermediate layer 23 further contains, from bottom to top, an ultra-thin quantum-dot layer 231 made of indium-nitride (InN) and a quantum-well layer 232 made of un-doped $Al_{1-m-n}Ga_mIn_nN$ ($0 \leq m, n \leq 1$, $m+n \leq 1$).

As shown in FIG. 2(b), the intermediate layer 23 can further contain an optional InN ultra-thin quantum-dot layer 231' on top of the un-doped $Al_{1-m-n}Ga_mIn_nN$ ($0 \leq m, n \leq 1$, $m+n \leq 1$) quantum-well layer 232.

As shown in FIG. 2(c), when there are multiple intermediate layers, every two immediately adjacent intermediate layers 23 and 23' have an intermediate barrier layer 28 made of un-doped $Al_{1-i-j}Ga_iIn_jN$ ($0 \leq i$, $j \leq 1$, $i+j \leq 1$) interposed therebetween.

The upper, intermediate, and lower barrier layers 24, 28, and 22 each have a total thickness between 5 Å and 300 Å, and a growing temperature between 400° C. and 1000° C. The ultra-thin quantum-dot layers 231 and 231' each have a thickness between 2 Å and 30 Å, and a growing temperature between 400° C. and 1000° C. The quantum-well layer 232 has a thickness between 5 Å and 100 Å. Even though the quantum-well layer and the barrier layers are all made of aluminum-gallium-indium-nitrides, their compositions are not required to be identical. That is, the (x, y), (p, q), (m, n), (i, j) parameters in the foregoing molecular formulas are not necessarily the same.

Figure 3A:
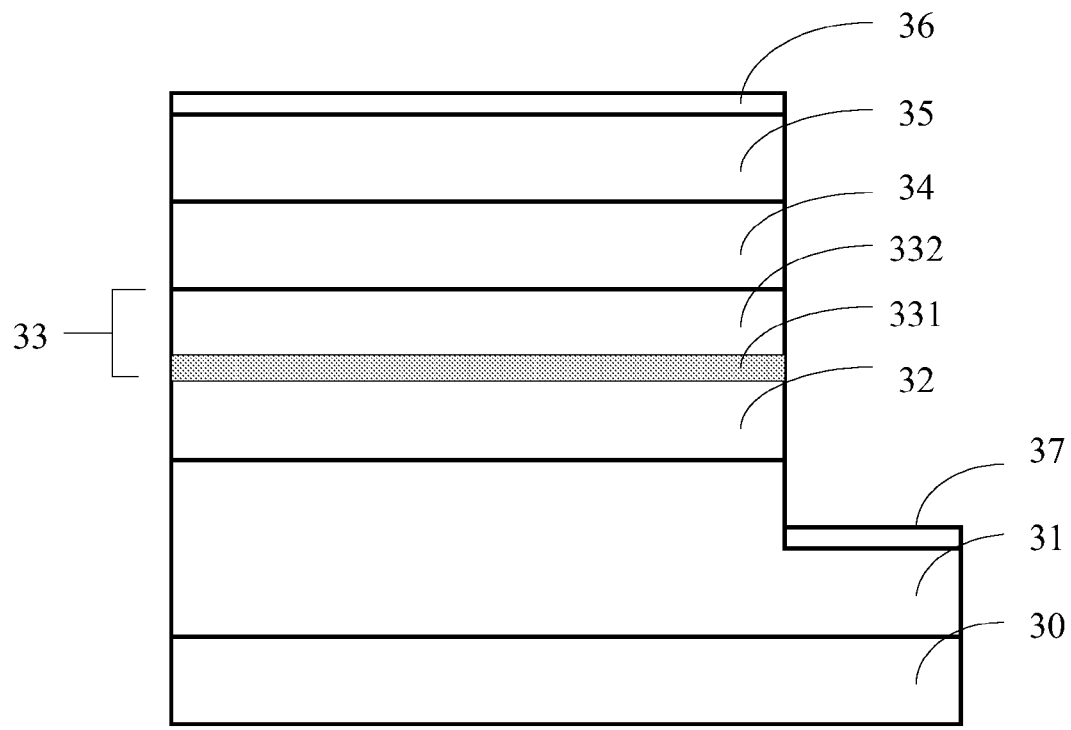
FIGS. 3(a), 3(b), and 3(c) are schematic diagrams showing the GaN-based LED structures according to a second embodiment of the present invention.
Figure 3B:
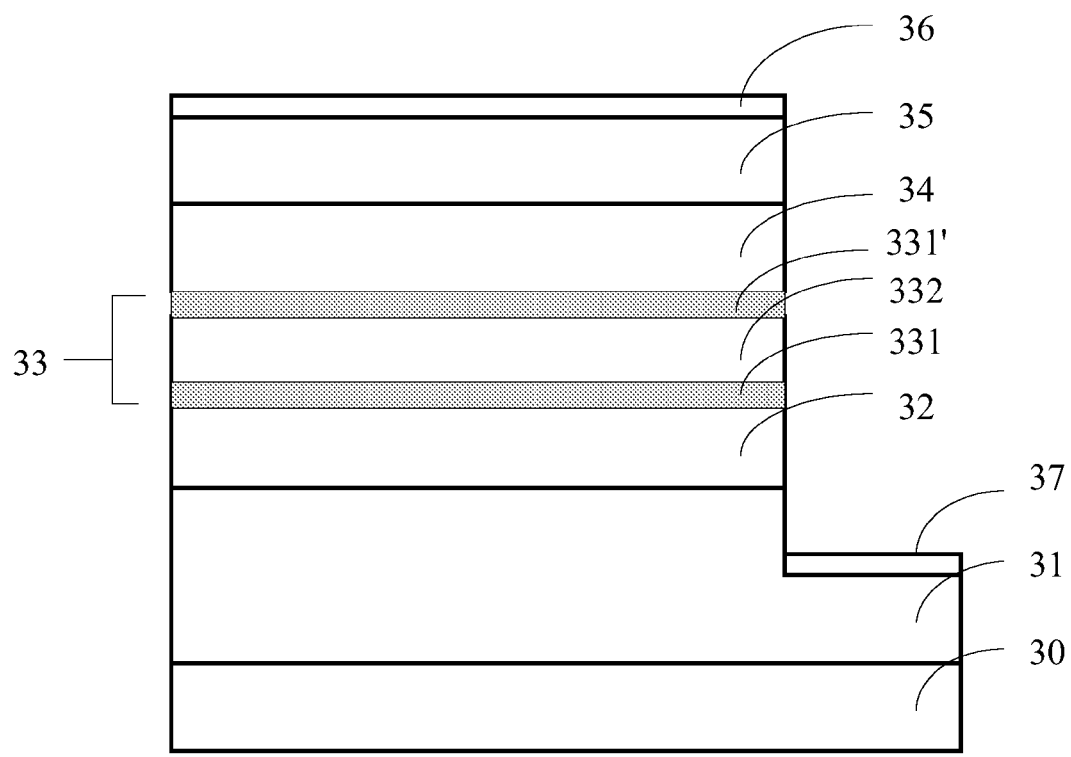
Figure 3C:
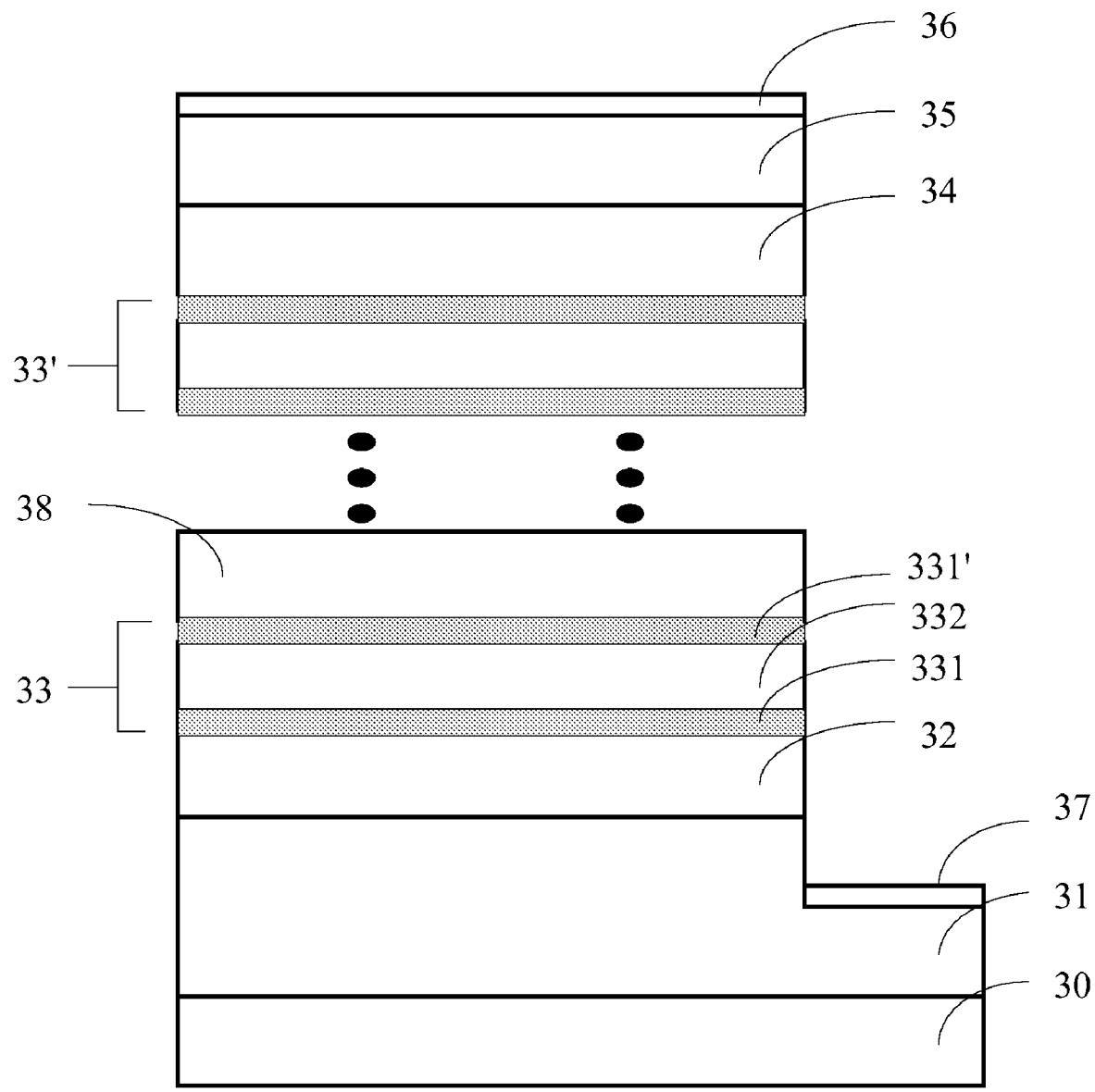

FIGS. 3(a), 3(b), and 3(c) are schematic diagrams showing the GaN-based LED structures according to a second embodiment of the present invention. The second embodiment and the foregoing first embodiment of the present invention actually have identical structures. The difference lies in the materials used for the respective intermediate layers. As shown in FIG. 3(a), the intermediate layer 33 further contains, from bottom to top, an ultra-thin layer 331 made of InN and quantum-well layer 332 made of un-doped $Al_{1-m-n}Ga_mIn_nN$ ($0 \leq m$, $n \leq 1$, $m+n \leq 1$).

As shown in FIG. 3(b), the intermediate layer 33 can further contain another optional InN ultra-thin layer 331' on top of the un-doped $Al_{1-m-n}Ga_mIn_nN$ ($0 \leq m$, $n \leq 1$, $m+n \leq 1$) quantum-well layer 332.

As shown in FIG. 3(c), when there are multiple intermediate layers, every two immediately adjacent intermediate layers 33 and 33' must have an intermediate barrier layer 38 made of un-doped $Al_{1-i-j}Ga_iIn_jN$ ($0 \leq i$, $j \leq 1$, $i+j \leq 1$) interposed therebetween.

The upper, intermediate, and lower barrier layers 34, 38, and 32 each have a thickness between 5 Å and 300 Å, and a growing temperature between 400° C. and 1000° C. The ultra-thin layers 331 and 331' each have a thickness between 2 Å and 10 Å, and a growing temperature between 400° C. and 1000° C. The quantum-well layer 332 has a thickness between 5 Å and 100 Å. Even though the quantum-well layer and the barrier layers are all made of aluminum-gallium-indium-nitrides, their compositions are not required to be identical. That is, the (x, y), (p, q), (m, n), (i, j) parameters in the foregoing molecular formulas are not necessarily the same.

Figure 4A:
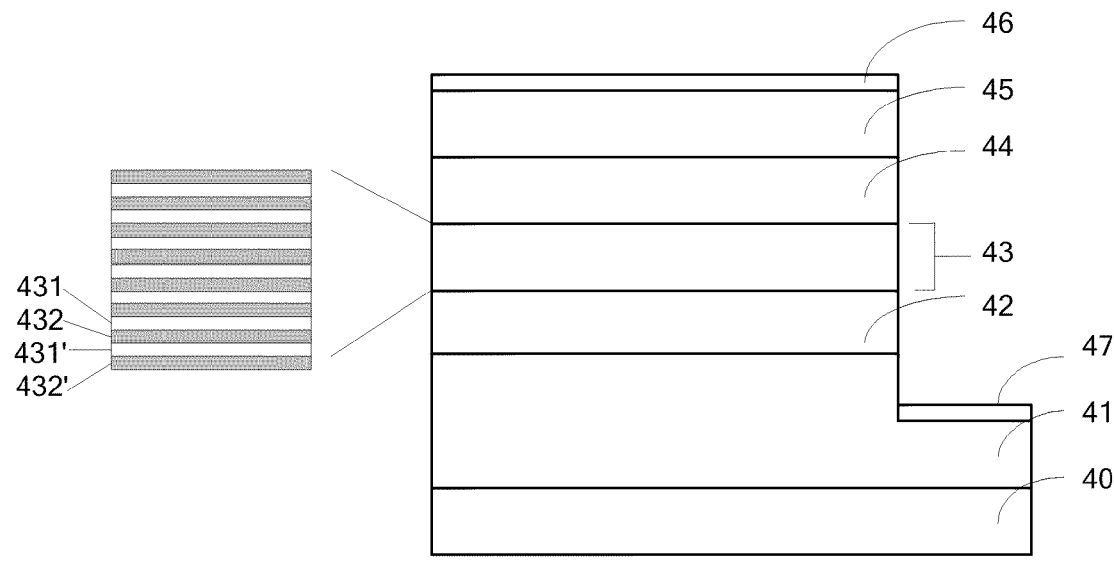
FIGS. 4(a) and 4(b) are schematic diagrams showing the GaN-based LED structures according to a third embodiment of the present invention.
Figure 4B:
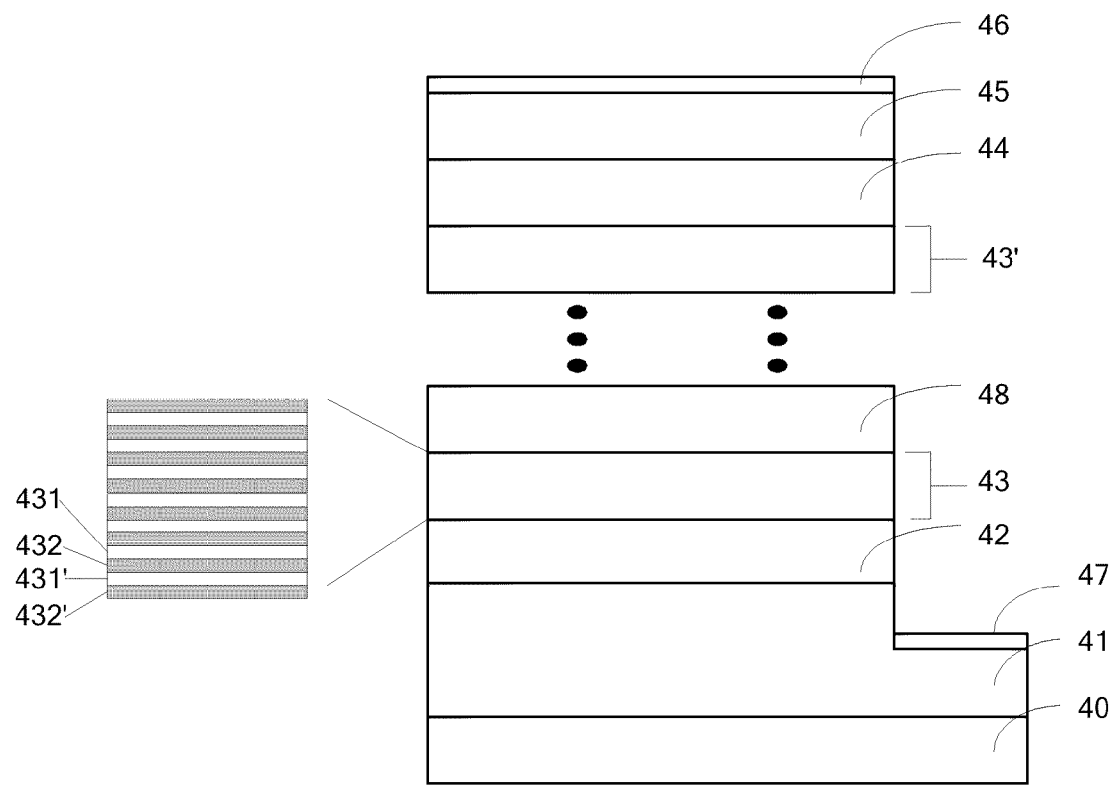

FIGS. 4(a) and 4(b) are schematic diagrams showing the GaN-based LED structures according to a third embodiment of the present invention. The third embodiment and the previous two embodiments of the present invention actually have identical structures. The difference lies in the materials used for the respective intermediate layers. As shown in FIG. 4(a), the intermediate layer 43 is a supper lattice well layer further containing at least an InN ultra-thin monolayer 431 and a GaN ultra-thin monolayer 432. Within the intermediate layer 43, the monolayers are sequentially stacked and interleaved with each other. For one example, from the lower barrier layer 42 up, there are InN ultra-thin monolayer 431, GaN ultra-thin monolayer 432, then another InN ultra-thin monolayer 431', and then another GaN ultra-thin monolayer 432', and so on. For another example, from the lower barrier layer 42 up, there are GaN ultra-thin monolayer 432, InN ultra-thin monolayer 431, then another GaN ultra-thin monolayer 432', and then another InN ultra-thin monolayer 431', and so on. The monolayers each have a thickness between 2 Å and 20 Å, and a growing temperature between 400° C. and 1000° C. Within the intermediate layer 43, there are at least one InN ultra-thin monolayer 431 and one GaN ultra-thin monolayer 432, making the total number of monolayers at least two. On the other hand, within the intermediate layer 43, there are at most five InN ultra-thin monolayers 431 and five GaN ultra-thin monolayers 432, making the total number of monolayers at most ten.

As shown in FIG. 4(b), when there are multiple intermediate layers, every two immediately adjacent intermediate layers 43 and 43' must have an intermediate barrier layer 48 made of un-doped $Al_{1-i-j}Ga_iIn_jN$ ($0 \leq i$, $j \leq 1$, $i+j \leq 1$) interposed therebetween.

The upper, intermediate, and lower barrier layers 44, 48, and 42 each have a total thickness between 5 Å and 300 Å, and a growing temperature between 400° C. and 1000° C. Even though the barrier layers are all made of aluminum-gallium-indium-nitrides, their compositions are not required to be identical. That is, the (x, y), (p, q), (i, j) parameters in the foregoing molecular formulas are not necessarily the same.

Figure 5A:
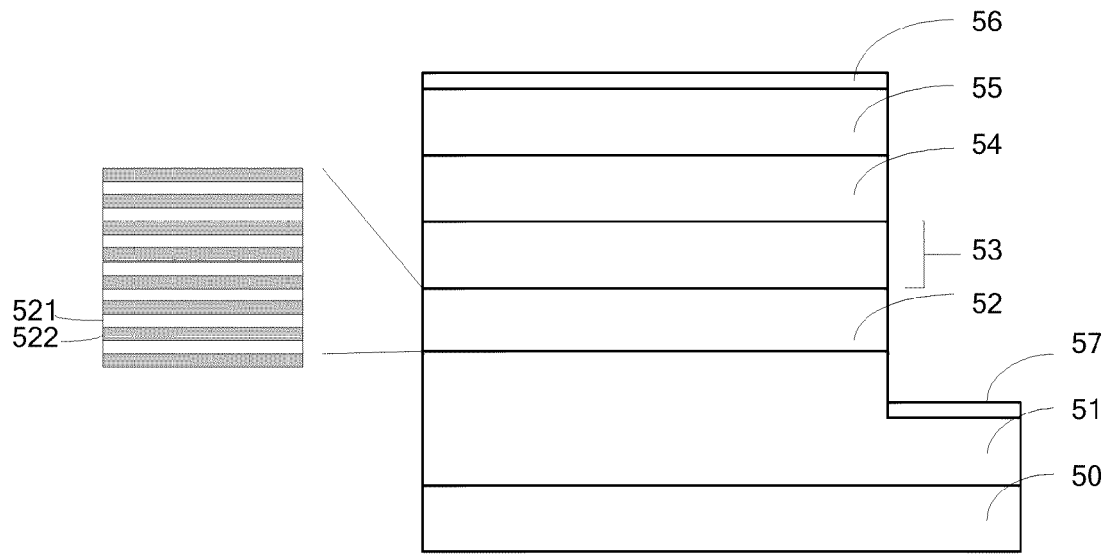
FIGS. 5(a) and 5(b) are schematic diagrams showing the GaN-based LED structures according to a fourth embodiment of the present invention.
Figure 5B:
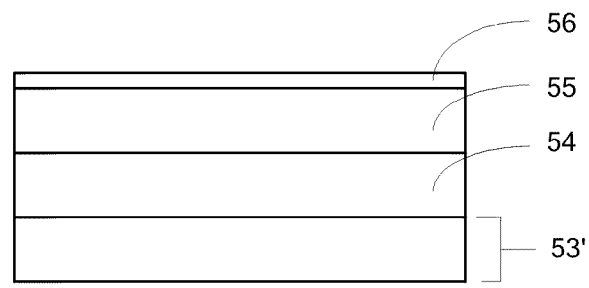
Figure 5B:
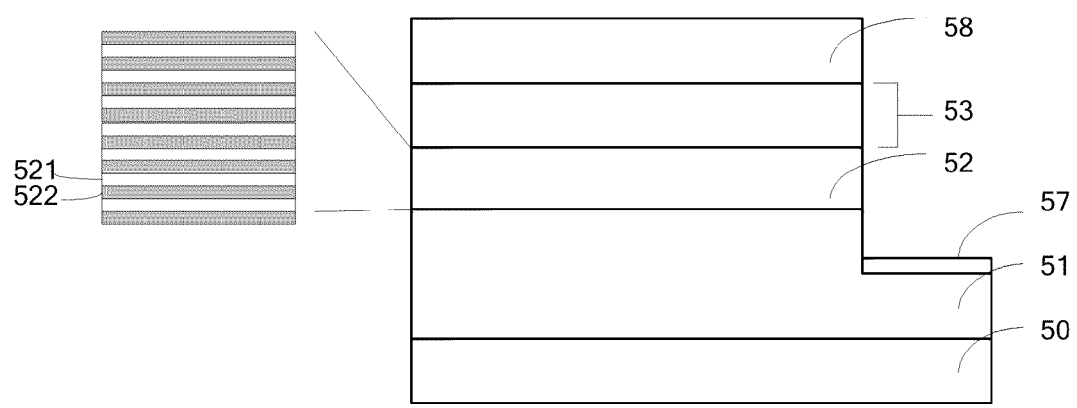

FIGS. 5(a) and 5(b) are schematic diagrams showing the GaN-based LED structures according to the fourth embodiment of the present invention. The fourth embodiment and the third embodiment of the present invention actually have identical structures. The difference lies in the materials used for the upper, intermediate, and lower barrier layers. As shown in FIGS. 5(a) and 5(b), the intermediate layer 53 has a structure and materials identical to the intermediate layer 43 of the third embodiment, and each barrier layer 52, 54, 58 also has a structure identical to that of the intermediate layer 43 but with different materials. Specifically, each barrier layer is a supper lattice barrier layer further containing at least an In-doped, AlN ultra-thin monolayer 521 and an In-doped, GaN ultra-thin monolayer 522. Within each the barrier layer, the monolayers are sequentially stacked and interleaved with each other, similar to the intermediate layer 43. The monolayers each have a thickness between 2 Å and 20 Å, and a growing temperature between 400° C. and 1000° C. Within each barrier layer, there are at least one AlN ultra-thin monolayer 521 and one GaN ultra-thin monolayer 522, making the total number of monolayers at least two. On the other hand, within each barrier layer, there are at most five AlN ultra-thin monolayer 521 and five GaN ultra-thin monolayer 522, making the total number of monolayers at most ten. The upper, intermediate, and lower barrier layers 54, 58, and 52 may contain different numbers of monolayers respectively. However, the barrier layers each have a thickness between 5 Å and 300 Å, and a growing temperature between 400° C. and 1000° C. FIG. 5(b) shows that there are multiple intermediate layers, every two immediately adjacent intermediate layers 53 and 53' must have an intermediate barrier layer 58 interposed therebetween.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A light-emitting layer structure of a GaN-based LED, wherein said LED comprises a sapphire substrate and comprises, on one side of said substrate from bottom to top, a n-type GaN contact layer, a light-emitting layer covering a part of an upper surface of said n-type GaN contact layer, a p-type GaN contact layer covering said light-emitting layer, a positive electrode covering said p-type GaN contact layer, and a negative electrode covering another part of said upper surface of said n-type GaN contact layer not covered by said light-emitting layer, wherein said light-emitting layer, sequentially from bottom to top, comprises:

- a lower barrier layer, wherein said lower barrier layer is a super lattice barrier layer comprising at least a first ultra-thin monolayer made of AlN and at least a second ultra-thin monolayer made of GaN, sequentially stacked and interleaved with each other;
- a plurality of intermediate layers with an intermediate barrier layer interposed between every two immediately adjacent intermediate layers, each intermediate barrier layer being a super lattice barrier layer comprising at least a third ultra-thin monolayer made of In-doped AlN and at least a fourth ultra-thin monolayer made of In-doped GaN sequentially stacked and interleaved with each other; and
- an upper barrier layer, wherein said upper barrier layer is a super lattice barrier layer comprising at least a fifth ultra-thin monolayer made of AlN and at least a sixth ultra-thin monolayer made of GaN, sequentially stacked and interleaved with each other.

2. The light-emitting layer structure of a GaN-based LED according to claim 1, wherein said intermediate layer is a super lattice well layer comprising at least a seventh ultra-thin monolayer made of InN and at least an eighth ultra-thin monolayer made of GaN, sequentially stacked and interleaved with each other.

3. The light-emitting layer structure of a GaN-based LED according to claim 1, wherein said upper, intermediate, and lower barrier layers each have a thickness between 5 Å and 300 Å.

4. The light-emitting layer structure of a GaN-based LED according to claim 2, wherein the seventh ultra-thin monolayers and the eighth ultra-thin monolayers have identical number of layers with no more than five layers respectively, and a thickness between 2 Å and 20 Å for each individual monolayer.

5. The light-emitting layer structure of a GaN-based LED according to claim 1, wherein the first ultra-thin monolayers and the second ultra-thin monolayers have identical number of layers with no more than five layers respectively, and a thickness between 2 Å and 20 Å for each individual monolayer.

6. The light-emitting layer structure of a GaN-based LED according to claim 1, wherein the third ultra-thin monolayers and the fourth ultra-thin monolayers have identical number of layers with no more than five layers respectively, and a thickness between 2 Å and 20 Å for each individual monolayer.

7. The light-emitting layer structure of a GaN-based LED according to claim 1, wherein the fifth ultra-thin monolayers and the sixth ultra-thin monolayers have identical number of layers with no more than five layers respectively, and a thickness between 2 Å and 20 Å for each individual monolayer.

* * * * *